United States Patent [19]

Prager et al.

[11] 4,247,882

[45] Jan. 27, 1981

[54] UNIVERSAL INPUT/OUTPUT SYSTEM CONSTRUCTION FOR PROGRAMMABLE CONTROLLERS

[75] Inventors: Jay M. Prager, Nashua, N.H.; Joseph F. Sadlow, North Reading; John K. Nitzsche, Concord; Thomas A. Nikonchuk, Tewskbury, all of Mass.; John E. Farrand, Nashua, N.H.; Roman Gonzales, Andover, Mass.; Hiroshi Matsumoto, Jruma, Japan

[73] Assignee: Gould Inc., Rolling Meadows, Ill.

[21] Appl. No.: 30,849

[22] Filed: Apr. 17, 1979

[51] Int. Cl.³ .............................................. H05K 7/02
[52] U.S. Cl. ...................................... 361/380; 179/98; 361/391; 361/395; 361/399; 361/426
[58] Field of Search .................. 179/98; 361/331, 334, 361/338-340, 380, 390-395, 426, 399

[56] References Cited

U.S. PATENT DOCUMENTS

| | | | |
|---|---|---|---|
| 3,689,128 | 9/1972 | Andreini | 361/331 |
| 3,784,728 | 1/1974 | Bortoli | 361/426 |
| 3,942,077 | 3/1976 | Powers | 361/331 |
| 4,002,955 | 1/1977 | Eggert | 361/391 |

Primary Examiner—Gerald P. Tolin
Attorney, Agent, or Firm—Mattern, Ware, Davis & Stoltz

[57] ABSTRACT

By providing an input/output housing which incorporates paired slider assemblies for supportingly maintaining a printed circuit board in secure electronic engagement between a central processor and external devices, with said printed circuit board being quickly and easily removable from the electronically engaged position, an input/output system for a programmable controller is achieved which is capable of being quickly and easily expanded as well as capable of rapid field assembly and field disassembly for removal or replacement of any required parts. In addition, the external equipment wiring is made to a terminal block which is mounted between the paired slider assemblies and pivotally engaged therein to provide readily accessible contact points for initial interconnection thereto, while also being pivotally movable and slidingly advanceable into the housing for continuous maintenance therein in a secure, hidden, easily accessible storage zone. In the preferred embodiment, all connectors in the input/output system are solderless connections to assure rapid assembly and disassembly capabilities.

18 Claims, 22 Drawing Figures

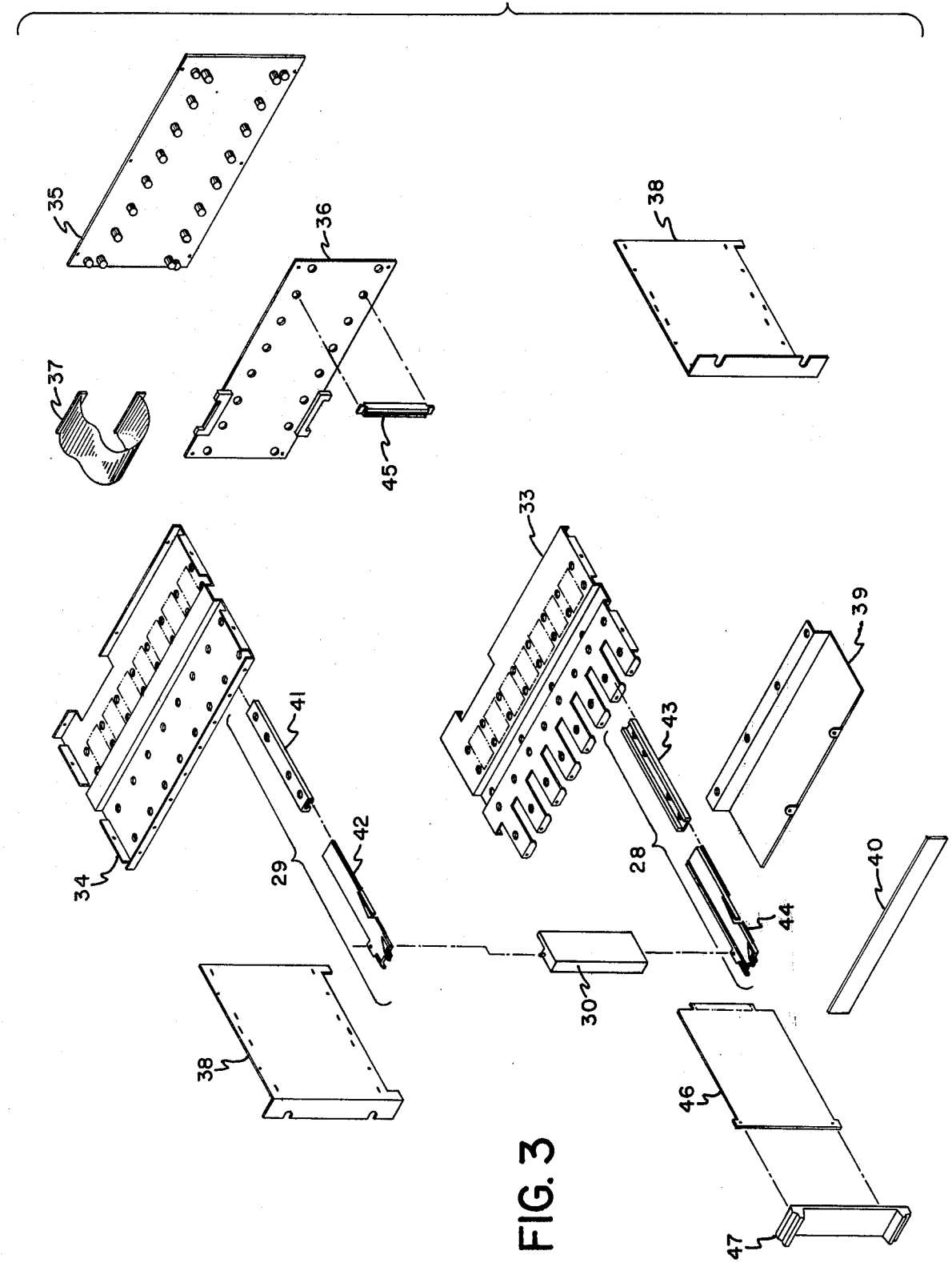

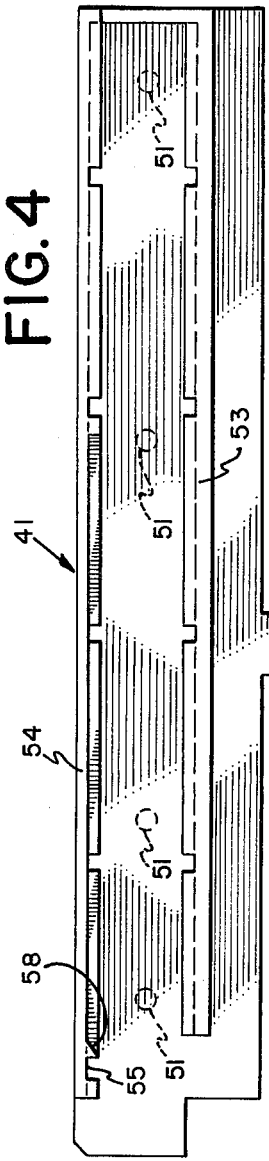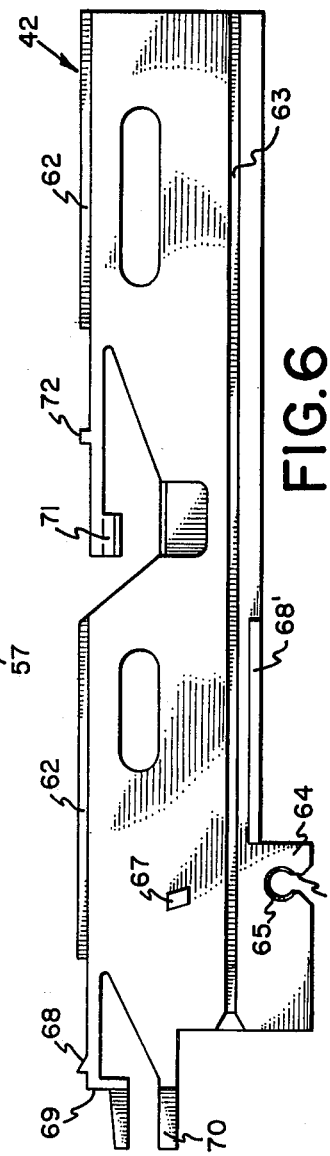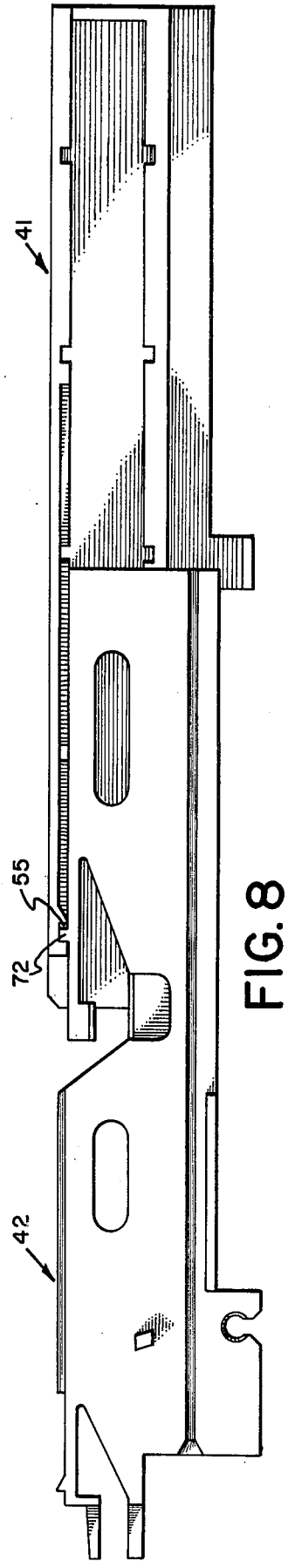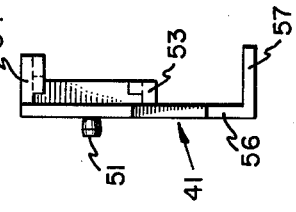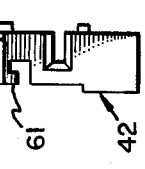

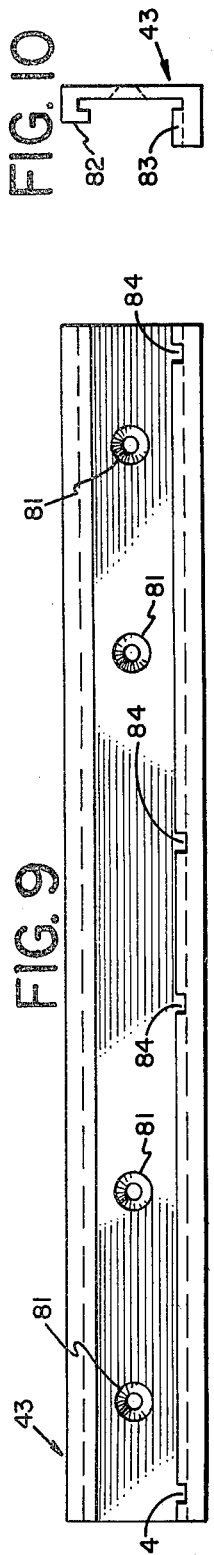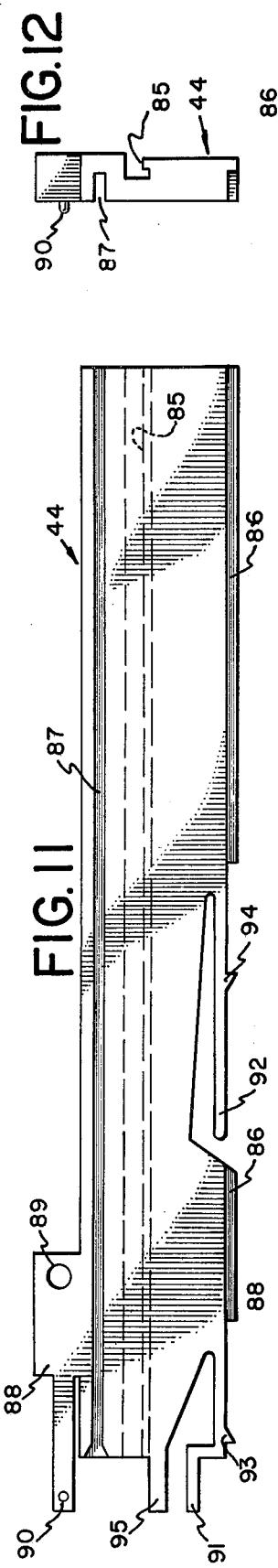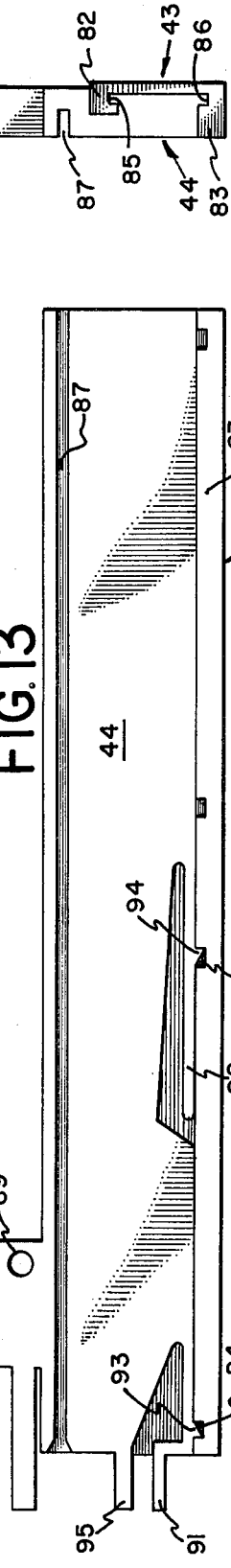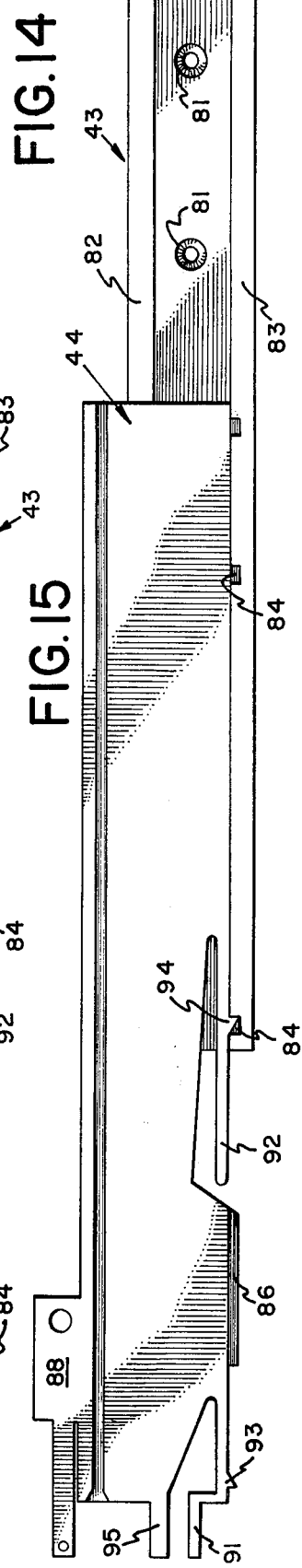

UNIVERSAL INPUT/OUTPUT SYSTEM CONSTRUCTION FOR PROGRAMMABLE CONTROLLERS

TECHNICAL FIELD

This invention relates to programmable controllers, and more specifically to expandable, multi purpose input/output systems for use therewith.

BACKGROUND ART

Typically, programmable controllers have been constructed with input/output systems being interconnected with the programmable controller in a manner which would require the external devices being controlled thereby to be disconnected whenever a particular input/output panel is removed, replaced, or rearranged. Consequently, costly, time consuming effort is generally required in these prior art systems to disconnect the input/output terminals from the various external equipment and, afterwards, effectuate the reconnection of the equipment in the desired manner.

In addition, the prior art system must be shut down in order to make the desired or required changes to an individual input/output circuit. Since shutdowns result in expensive down time, additional costs are incurred in replacing and removing input/output circuits from these prior art systems.

More recently, advances have been made in modular input/output panel constructions for programmable controllers. These more recent prior art systems have resolved some of these prior art difficulties by achieving an input/output assembly which does not require complete shutdown of the programmable controller and allows the external equipment wiring to remain in their original connections while the input/output module is removed, replaced or repaired. These systems represent the best prior art patents of which we are aware and are exemplified in U.S. Pat. No. 3,942,077 of Howard A. Powers.

In Powers, input/output modules are taught which are capable of being directly plugged into an input/output panel housing which incorporate fixed terminals to which the external equipment is connected. In this way, the previous necessity for disconnecting the external equipment wiring during removal or replacement of the input/output modules is eliminated.

In addition to Powers, co-inventors Jay M. Prager and Joseph F. Sadlow have a patent application pending in the United States Patent and Trademark Office relating to a Modular Panel Construction for Programmable Controller, bearing Ser. No. 883,277 and filed Mar. 3, 1978. This patent application, the references cited therein, and Powers represents the best prior art of which we are aware.

Although the Prager and Sadlow patent application discloses a system which overcomes some of the drawbacks experienced with the input/output module system of Powers, both Powers and Prager and Sadlow require the use of modules, wherein each module serves as an independent housing for a particular printed circuit board. Prager and Sadlow have achieved a system which has made substantial advances over the input/output module disclosed in Powers, however, the input/output module disclosed in their patent application has been unable to meet the demands and constraints imposed upon systems wherein only the printed circuit board is mounted, without a separate modularized housing supportingly containing the printed circuit board.

In particular, these prior art plug-in input/output modules are not able to meet the different requirements for being both panel mounted or rack mounted, without required specially design adaptors. Also, the prior art modules have been found to require a greater area per input/output than various users have available as well as being generally unable to meet all of the various standards and requirements imposed upon a single system throughout the world.

Therefore, it is the principal object of this invention to provide an input/output system, for interconnection with a central processor to form a programmable machine controller, which supportingly maintains a plurality of input/output printed circuit boards in readily accessible positions for quick and easy insertion, removal and replacement of the printed circuit board without necessitating removal of the external devices electronically engaged thereto.

Another object of this invention is to provide an input/output system having the characteristic features defined above wherein the printed circuit board can be simply positioned in a holder and rapidly and easily moved into secure and complete electronic engagement with both the external devices and the central processor.

Another object of this invention is to provide an input/output system having the characteristic features defined above which is capable of rapid assembly and disassembly without requiring soldering, thereby assuring easy and reliable field maintenance while also being reliable and reasonably priced.

A further object of the present invention is to provide an input/output system having the characteristic features defined above which is quickly and easily expanded by simply assembling and interconnecting additional units up to the maximum capabilities of the central processor.

Another object of this invention is to provide an input/output system having the characteristic features defined above which is capable of meeting all worldwide standards as well as being capable of being either rack mounted or panel mounted.

Another object of this invention is to provide an input/output system having the characteristic features defined above as well as having a high input/output density, thereby providing a maximum number of input/output points per square area as is feasible.

Other and more specific objects will in part be obvious and will in part appear hereinafter.

DISCLOSURE OF THE INVENTION

The input/output system of the present invention eliminates the prior art problem and achieves a multipurpose, universally applicable, rapidly expandable construction by providing an input/output system which is capable of (1) being constructed for either panel mounting or rack mounting using the same components, (2) having the external equipment wiring terminal block positioned conveniently for assembly ease as well as being positioned in a secure but accessible storage location after assembly, (3) receiving a plurality of input/output printed circuit boards as a quick and easy plug-in board wherein all interconnections are simultaneously made when inserted and broken when disconnected, and (4) being quickly and easily assembled and interconnected to the controller or cooperating systems.

One of the unique and important components of the input/output system of this invention are the slider assemblies mounted to the input/output housing in cooperating pairs for supportingly receiving and positioning the input/output printed circuit boards for controlled electronic engagement between the central processor and the external equipment. In addition, the slider assemblies support the terminal block for interconnection of the external equipment wiring to the printed circuit board as well as providing the terminal block with alternative positions for assembly and storage.

By providing an input/output system which can be assemblied for either panel mounting or rack mounting, the input/output system of the present invention is capable of satisfying all of the varying requirements for system constructions and arrangements in the different countries throughout the world. In particular, most European countries employ rack mounted constructions, while panel mounting is preferred in the United States and in Japan. Prior art systems are not capable of satisfying both requirements and, as a result, require either separate units or special adaptors to be manufactured in order to satisfy these varying standards. With the input/output system of the present invention, either a rack mounting system or panel mounting system is easily and rapidly achieved by merely positioning two support panels in one of their two alternative locations.

In the preferred embodiment of this invention, each input/output printed circuit board incorporates front connectors and rear edge connectors, in order to easily simultaneously electronically interconnect the printed circuit board to the external equipment and the central processor. By simply positioning the printed circuit board in the slider assembly and inserting the printed circuit board into the housing, the rear connectors of the printed circuit board are quickly and easily electronically engaged with rear connectors mounted in the back plane of the input/output housing while the forward connectors of the printed circuit board are electronically engaged with the external devices through a front cover-connector mountable to the input/output system.

The front cover-connector may be constructed in many alternative ways to electronically interconnect the front connectors of the printed circuit board with the contact points of the external devices, all of which depend upon the type of front connector employed on the printed circuit board. Any one of these various alternatives may be employed as long as rapid assembly is assured and secure electronic engagement is provided, with removal or replacement of printed circuit boards being capable without disconnecting any external equipment wiring.

The versatility, field maintainability and rapid expandability of the input/output system of this invention is further enhanced by providing rapidly interconnectable input/output systems which also incorporate address selection means for ease of use. Furthermore, the entire input/output system is easily dis-assemblied and assembled either in its entirety or by merely removing a single printed circuit board, without requiring any soldering or any repeated hand wiring.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings, in which:

FIG. 3 is an exploded perspective view of the input/output system of this invention;

FIG. 4 is a top plan view of one embodiment of a track guide which forms part of the slider assembly;

FIG. 5 is an end view of a track guide of FIG. 4;

FIG. 6 is a top plan view of one embodiment of the slider which forms a part of the slider assembly;

FIG. 7 is an end view of the slider of FIG. 6;

FIG. 8 is a top plan view of one embodiment of the slider assembly shown fully assembled in its extended engaged position;

FIG. 9 is a top plan view of a second embodiment for a track guide of the slider assembly;

FIG. 10 is an end view of the track guide of FIG. 9;

FIG. 11 is a top plan view of another embodiment of a slider for the slider assembly;

FIG. 12 is an end view of the slider of FIG. 11;

FIG. 13 is a top plan view of the second embodiment of the slider assembly shown fully assembled in its completely engaged position;

FIG. 14 is an end view of the assembled slider assembly of FIG. 13;

FIG. 15 is a top plan view of the second embodiment of the slider assembly shown in its extended engaged position;

BEST MODE FOR CARRYING OUT THE INVENTION

Figure 1:
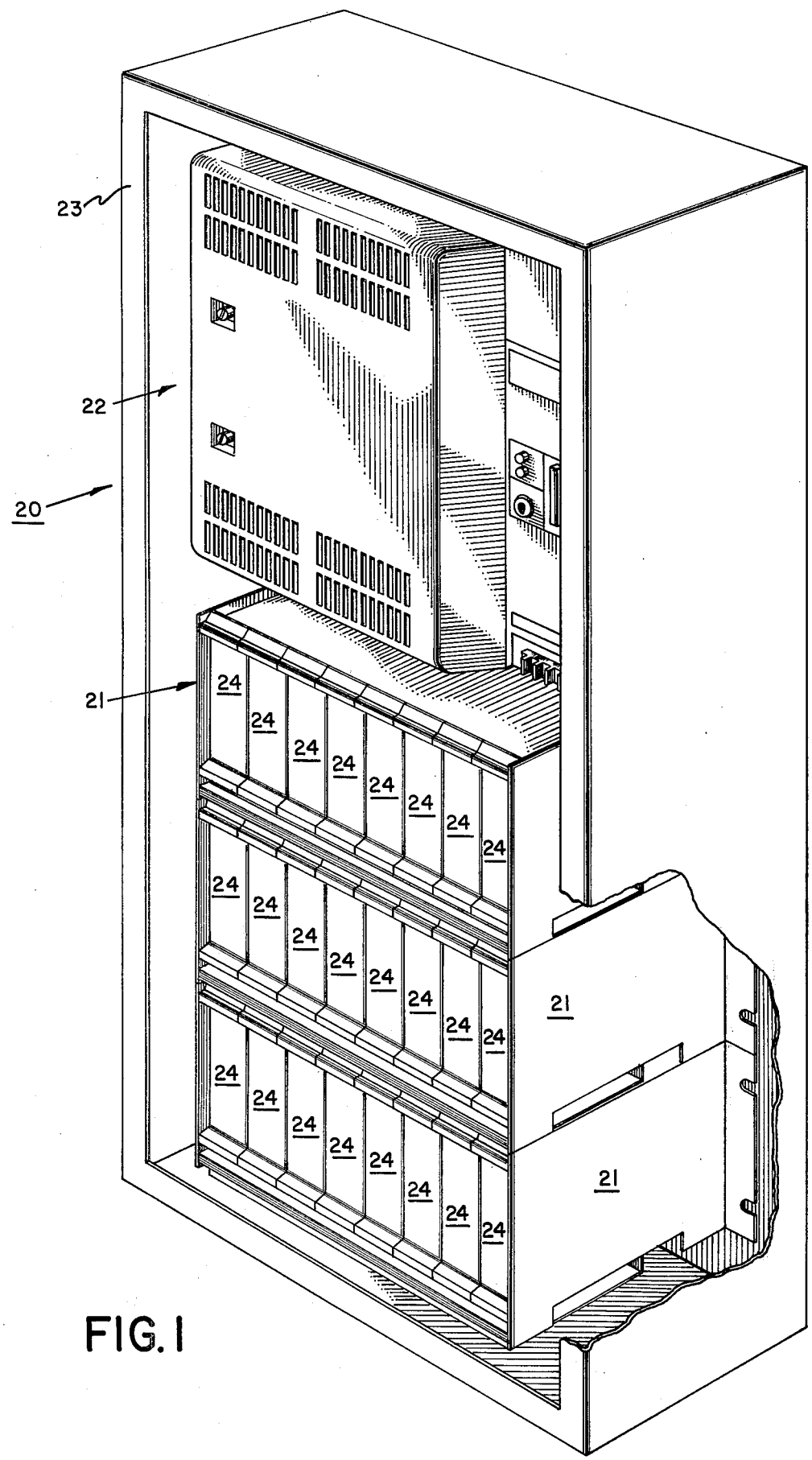
FIG. 1 is a perspective view of a programmable controller incorporating the input/output system of this invention.

In FIG. 1, a programmable controller 20 is shown incorporating 3 input/output system 21 of this invention and a combination central processor, memory, and power supply forming mainframe 22. In this particular embodiment, programmable controller 20 is shown mounted in a cabinet 23 with input/output systems 21 mounted to the rear panel of cabinet 23. As is well known in the art, programmable controller 20 is constructed to receive information from various external equipment, process this information and, in accordance with a particular preset instruction program, provide output information in order to control the particular external equipment connected thereto.

Mainframe 22 incorporates the user control program, receives the input information from the input circuit boards, which are incorporated within input/output system 21, process the information received, and delivers output instructions to output circuit boards also incorporated in input/output system 21. The power supply portion of mainframe 22 drives the central processor and the various circuits of the input/output system 21.

As shown in FIG. 1, each input/output system 21 preferably incorporates eight independent input/output modules 24. In this embodiment, each input/output module 24 accommodates eight input/output points. Although input/output system 21 may be employed with less than eight input/output modules 24, the maximum capacity for each input/output assembly is 64 input/output points.

Since the embodiment shown in FIG. 1 contains three input/output systems, a total of 192 input/output points are available to the user. Depending upon the users' requirements, fewer input/output systems 21 may be employed or additional input/output systems 21 can be quickly and easily incorporated into controller 20 in order to expand the available input/output points. Regardless of the particular number of input/output points required, each input/output module 24, with its eight input/output points, has achieved an increased packing density over prior art systems, providing increased controller capability for the size of the controller. As is well known in the art, each input/output module 24 provides either input information or output instructions depending upon the type of printed circuit board employed and the equipment connected thereto.

INPUT/OUTPUT SYSTEMS

Figure 2:
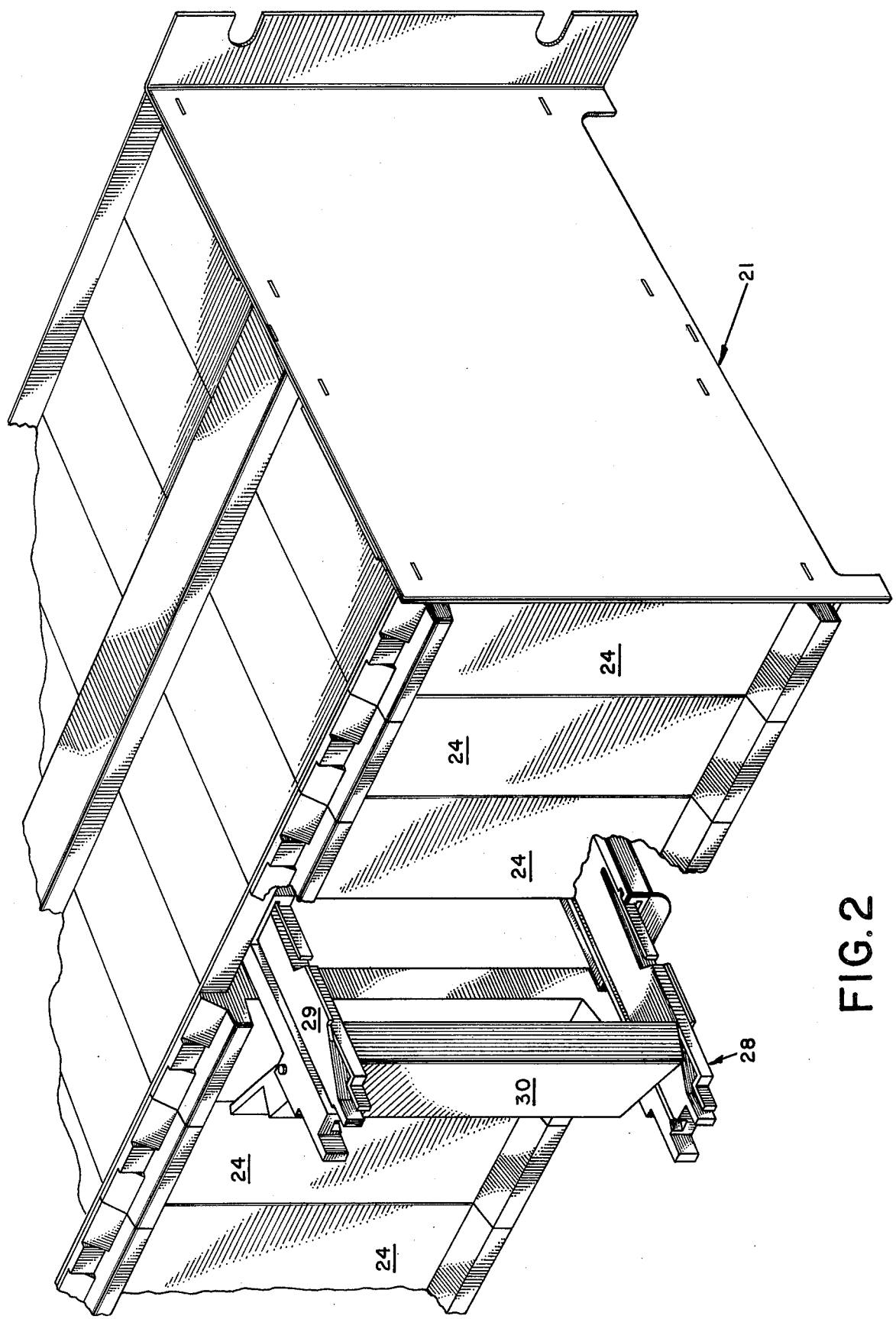
FIG. 2 is a perspective view of an assembled input/output system with one slider assembly shown in its open position with the printed circuit board removed therefrom.

In FIG. 2, one input/output system 21 is shown with six input/output modules 24 fully assembled and one module 24 partially assembled. In order to reduce the physical size of prior art programmable controllers, wherein each input/output circuit was contained in an individual modularized housing, the present invention has completely eliminated modularized housings and has provided a system wherein the input/output printed circuit board is securely mounted in the input/output assembly while still having all of the advantages previously only obtainable with the prior art modularized housing systems.

As briefly discussed above, these modularized housing systems achieved a high degree of flexibility by providing quick removability and replaceability of each input/output module without requiring rewiring or shutdown of the system. This not only provided for quick system repair, but also achieved greater flexibility for rearrangement of input/output modules whenever required. Until the present invention, however, these advantageous characteristics were only obtainable with modularized housings and were not available in systems where input/output printed circuit boards were employed independently, without self-contained modularized housings.

One of the ways in which input/output system 21 achieves this previously unobtainable goal is by incorporating a lower slider assembly 28 paired with an upper slider assembly 29 as integral parts of each input/output module 24. Associated with paired slider assemblies 28 and 29 is a terminal block 30, which is pivotably mounted between upper and lower slider assemblies 28 and 29. Terminal block 30 also has limited vertical movement within slider assemblies 28 and 29 in order to assure that secure, interconnected engagement of terminal block 30 with the front cover connector will be easily effectuated.

As shown in FIG. 2, terminal block 30 pivots between slider assemblies 28 and 29 when the slider assemblies are in their extended positions. This open, pivoted position provides the user with a readily accessible location for mounting the external equipment wiring thereto.

As will be more fully described below, each slider assembly 28 and 29 incorporates a printed circuit board receiving recess for positioning and securely maintaining the input/output printed circuit board in electronic engagement with the central processor. However, when an input/output circuit board must be removed or replaced, the board can be quickly and easily removed from slider assemblies 28 and 29. In addition, since slider assemblies 28 and 29 are moveable from a first closed position to a second extended position, as shown in FIG. 2, the printed circuit board can be disconnected and inspected while still mounted between slider assemblies 28 and 29. The initial movement of the printed circuit board assures disconnection of all electronic engagement of the particular printed circuit board with the system, thereby preventing any electronic hazards from occurring.

By referring to FIG. 3, the components which form input/output system 21 can best be understood, as well as its actual construction and interconnected arrangement. The basic housing for input/output system 21 comprises a lower support plate 33, an upper support plate 34, a back plate 35, a back plane connection system 36, cable connector 37, two side plates 38, a wire support plate 39 and a wire cover 40. With these eight items, the entire input/output system is created, preferably employing easily formed sheet metal stampings or easily molded manufacture components. Preferably, cable connector 37 comprises a 50 conductor ribbon cable.

The entire input/output system 21 is completed by mounting the components which form each of the eight input/output modules 24. For purposes of simplicity, FIG. 3 shows the components required for a single input/output module, although it would be obvious to one skilled in the art that seven additional sets of components would be mounted to each of the other seven positions available for the input/output modules.

As shown in FIG. 3, each input/output module 24 incorporates an upper slider assembly 29 comprising track guide 41 which is securely mounted to upper plate 34 and a cooperating slider 42 which is slidably engaged with track guide 41.

Similarly, lower slider assembly 28 comprises a lower track guide 43 which is securely mounted to lower support plate 33 and incorporates cooperating slider 44 slidably engaged therewith. Terminal block 30 is pivotally and adjustably mounted to sliders 42 and 44 for accurate pivotable movement when sliders 42 and 44 are in their extended position. Rear edge connector 45 is mounted to back plane 36 for mating receipt of the printed circuit board when engaged in its operational position.

Input/output module 24 is then completed by positioning input/output printed circuit board 46 and front connector 47 in their electronically engaged positions wherein printed circuit board 46 is engaged between slider assemblies 28 and 29 with connector 47 electronically engaging terminal block 30 with printed circuit board 46.

In addition to providing a high density, compact, multi-purpose, expandable input/output system which is capable of quick and easy disengagement of each input/output circuit and replacement or rearrangement thereof, the present invention also achieves a unique input/output system construction which can be employed for either panel mounting or rack mounting. It has been found that manufacturers in both the United States and Japan prefer to amount controller systems in either self-contained cabinets or directly to panels wherein these assemblies are mounted along the rear plane thereof. This arrangement is shown in FIGS. 1 and 2.

However, most European manufacturers prefer to have controller systems mounted in a rack arrangement wherein each individual component is mounted along a forward edge thereof. Input/output system 21 of the present invention achieves maximum flexibility with a minimization of parts by providing side mounting panels 38 which are reversible, depending upon the particular preferred mounting arrangement. When the flanged holding portion of side panels 38 are positioned at the rear, as shown in FIGS. 1 and 2, the input/output assembly is ready for panel mounting. However, when side panels 38 are positioned with the bracket portion thereof mounted along the forward edge, as shown in FIG. 3, the resulting input/output assembly 21 is ready for rack mounting. In this way, input/output assembly 21 is readily adaptable to any environment or arrangement desired with simplicity and ease in order to assure maximum field maintainability as well as field assembly.

SLIDER ASSEMBLY

In order to provide an input/output system 21 with the desired versatility and flexibility, each input/output module 24 must be readily accessible for installation of the user wiring as well as being able to accomodate an input/output printed circuit board quickly and easily for interconnection, disconnection, and removal from assembly 21. This heretofor unobtainable goal has been reached by input/output system 21 of the present invention by incorporating slider assemblies 28 and 29 in each input/output module. By referring to FIGS. 4 through 8, the construction and operation of the preferred embodiment for a slider assembly can best be understood. For exemplary purposes only, an upper slider assembly 29 is discussed. However, since lower slider assembly 28 is identical in function and operation to upper slider assembly 29 and represents the mirror image of upper slider assembly 29, the construction and operation of slider assembly 28 will be apparent from this disclosure.

As shown in FIGS. 4 through 8, slider assembly 29 comprises track guide 41 and slider 42. As discussed above, track guide 41 is affixed to upper support plate 34 of input/output system 21 in any desired fashion. Preferably track guide 41 is secured to support plate 34 by engaging pins 51 formed on the lower surface of track guide 41 and which lockingly engaged cooperating, mating recesses formed in base plate 34.

As shown in FIGS. 4 and 5, a plurality of locking pins 51 are positioned along the central axis of track guide 41 extending from the lower surface thereof. In this way, a quick and easy snap-in construction is achieved.

Track guide 41 also incorporates rail defining members 53 and 54. Although various alternative constructions may be employed in order to provide the necessary secure, controlled, free-sliding capability required by the input/output system of the present invention, it has been found that the use of two cooperating rail members 53 and 54 attain the desired goals while minimizing manufacturing expenses and assuring continuous trouble-free operation.

As shown in FIGS. 4 and 5, rail members 53 and 54 are in juxtaposed spaced relationship to each other with each extending longitudinally along substantially the entire length of track guide 41. Furthermore, rails 53 and 54, in the preferred embodiment, comprise flanged posts forming a substantially inverted L shape. As will be more fully described below, slider 42 incorporates cooperating ledge members which are engaged between flange posts 53 and 54 and the surface of track guide 41, from which the inverted L shape posts extend. In this way, secure, captive, sliding engagement is assured with substantially any possible jamming or unwanted locking of the slider within the track guide being eliminated.

Track guide 41 also incorporates a recess 55 formed in rail 54 at its upper forward end. As will be more fully described below, recess 55 cooperates with locking tabs formed on slider 42 in order to control and maintain slider 42 in locked engagement with track guide 41 between its two alternative, engaged positions.

Rail 54 of track guide 41 also incorporates a bevelled surface 58 which is positioned directly behind recess 55 in substantially the same horizontal plane of recess 55. Bevelled surface 58 cooperatingly cammingly controls a rear locking post formed on slider 42. As will be more fully described below, bevelled surface 58 assures that slider 42 can be easily moved from its fully engaged position to its extended position and securely and automatically locked in that extended position without fear of having the slider become dislodged when not so desired.

Guide 41 also incorporates arm 56 which extends from one edge of track guide 41 and incorporates upstanding flange 57 mounted at the terminating edge of arm 56. Arm 56 and upstanding flange 57 establish a rearward, position engaging and pivot-preventing lock for terminal block 30, when terminal block 30 is rotated and inserted into input/output assembly 21. By incorporating arm 56 and upstanding flange 57, a firm position locating and locking means is achieved for holding the terminal block against undesirable rotation.

In FIGS. 6 and 7, the detailed construction of slider 42 can best be seen. As shown therein, slider 42 incorporates ledge members 61 and 62 which extend along substantially the entire length of slider 42. Ledge member 61 is constructed for cooperative interengagement with rail 53 while ledge member 62 is constructed for cooperative sliding engagement with rail 54 of track guide 41. Since rails 53 and 54 of track guide 41 are constructed as flanged posts substantially comprising inverted L shapes, rails 53 and 54 peripherally surround and slidingly engage ledges 61 and 62 of slider 42. In this way, secure, trouble-free sliding interengagement of slider 42 with track guide 41 is provided.

In order to securely hold and maintain an input/output printed circuit board, in position, slider 42 incorporates elongated channel 63 formed in the top surface thereof and extending the entire length of slider 42. For added convenience, channel 63 comprises bevelled surfaces at its forward edge in order to assure ease of installation and insertion of the printed circuit board therein.

Slider 42 also incorporates a terminal block supporting platform 64 which is mounted to the edge of slider 42 adjacent elongated channel 63. Platform 64 incorporates pivot hole 65 formed therein. Pivot hole 65 provides for captured engagement of cooperating pivot pins on the terminal block to assure secure holding and pivoting engagement of the terminal block platform 64 of slider 42. In this preferred embodiment, pivot hole 65 also incorporates open ended slot 66 in order to provide ease of installation of the terminal block pivot pins therein.

In addition, slider 42 incorporates an upstanding post 67 positioned on the top surface of slider 42 in order to provide a secure firm stop for the terminal block when the terminal block is pivoted about the pivot axis defined by pivot hole 65 into its position for installation of the equipment wires. In this way, over pivoting is prevented as well as providing a secure holding point for added convenience during the wire installation process.

Once all of the connections have been made to the terminal block, the terminal block is pivoted to its normal, position, ready for insertion into input/output system 21. In order to provide a secure, firm, pivot limiting stop, slider 42 incorporates elongated raised wall 68' to provide the necessary holding surface for the terminal block when pivoted to its normal position for installation.

As discussed above, slider 42 is slidingly captured within track guide 41 and is readily movable between two engaged positions. A first position, is the fully engaged position wherein slider 42 is mounted completely within track guide 41 and input/output system 21, with the printed circuit board electronically engaged between the associated hardware. In order to assure that slider 42, when inserted into input/output system 21, is maintained in the secured fully engaged position, slider 42 incorporates a locking post 68 formed at its foward end. Locking post 68 is mounted on movable arm 69 in order to allow disengagement of locking post 68 whenever such disengagement is desired. Of course, when locking post 68 is in its fully engaged position, post 68 is captured by recess 55 of rail 54 of track guide 41.

In order to provide ease of operation and disengagement of slider 42 from its fully engaged position, slider 42 also incorporates rigid post 70 positioned in juxtaposed spaced relationship to movable arm 69. In this way, locking post 68 can be easily disengaged from recess 55 of track guide 41 by merely squeezing arm 69 and post 70 together. Such squeezing movement causes movably arm 69 to advance towards rigid post 70, thereby dislodging locking post 68 from its engaged position within recess 55 of track guide 41. Once locking post 68 has been removed from recess 55, slider 42 is advanced forwardly until reaching its second extended, captured position, shown in FIG. 8.

As shown in FIGS. 6 and 8, slider 42 incorporates a second movable arm 71 which also has formed thereon a locking post 72. In the preferred embodiment, locking post 72 comprises a substantially rectangular shape.

As slider 42 is moved from its first fully engaged, captured position to its second, extended, captured position, locking post 72 advances along the top edge of the L shaped flanged portion of rail 54. Since rail 54 is provided with bevelled surface 58, as discussed above, locking post 72 advances toward recess 55, until bevelled surface 58 comes into camming engagement with locking post 72 and causes the entire arm 71 to be angularly moved inwardly, deflecting locking post 72 out of locking position until locking post 72 passes by bevelled surface 58. Once locking post 72 has moved past bevelled surface 58, the entire pivotably arm 71 moves back to its original position causing locking post 72 to be securely engaged in recess 55 of track guide 41. In this way, slider 42 is automatically securely lockingly captured in its second extended position.

As discussed above, this extended position is employed for initial wiring of the terminal block, as well as for making any repairs that may be required. Also, this position may be employed for exposing a portion of the printed circuit board in order to check various components thereon. In addition, partial access to the input/output system 21 can be made, if so desired.

Once slider 42 has been moved into its second, extended position, as shown in FIG. 8, slider 42 can be quickly and easily disengaged from this position and returned to its fully captured position by simply moving arm 71 of slider 42 inwardly until locking post 42 is disengaged from recess 55 of track guide 43. Once locking post 72 has been moved out of engagement with recess 55 of track guide 41, slider 42 is ready for trouble-free, controlled sliding movement along track guide 41 back to its initial position.

Since locking post 68 of arm 69 incorporates a bevelled rear surface, arm 69 automatically advances towards post 70 when locking post 68 contacts the forward edge of rail 54 of track guide 41. The rear bevelled surface of locking post 68 provides a camming action, deflecting arm 69 inwardly until arm 69 can move back to its original position with locking post 68 securely engaged in recess 55 of track guide 41. Once in its secured, locked position, slider 42 is returned to its original securely engaged position ready for insertion of the printed circuit board and full operation.

ALTERNATIVE EMBODIMENT OF SLIDER AND TRACK GUIDE

In FIGS. 9 through 15, an alternative construction of a track guide and a slider is shown in detail. For convenience and exemplary purposes only, a lower slider and track guide are shown and will be discussed in detail. As discussed above, the upper slider and track guide of this embodiment is identical in construction and operation and comprises the mirror image of the parts herein disclosed.

In this embodiment, track guide 43 incorporates a plurality of through holes 81 positioned along the central axis of track guide 43 longitudinally extending thereon. Through holes 81 are employed for captured engagement of fastening means which are employed to secure track guide 43 to the support plate.

As discussed with the previous embodiment, track guide 43 incorporate rails 82 and 83 for captured sliding engagement with slider 44. As shown in FIG. 10, rails 82 and 83 comprise substantially L shaped flange posts in order to provide the desired captured sliding engagement with cooperating ledges of slider 44.

In addition, this embodiment of track guide 43 incorporates a plurality of notches 84 formed in rail 83. As will be more fully discussed below, although only two of the plurality of notches 84 are employed for lockingly engaging and positioning this embodiment of slider 44 in its two alternative positions, the use of a plurality of recesses 84 spaced along rail 83 in a symmetrical pattern establishes a track guide 43 having a completely symmetrical construction which allows the track guide 43 to be used for both the upper and lower track guides.

In FIGS. 11 and 12, the construction of this embodiment of slider 44 can best be seen. In this embodiment, slider 44 incorporates elongated, longitudinally extending ledge members 85 and 86 which extend, substantially parallel, along substantially the entire length of slider 44. As shown in FIG. 14, when slider 44 is engaged with track guide 43, ledge 85 is slidingly captured by rail 82 while ledge 86 is slidingly engaged by rail 83. In this way, slider 44 is maintained in a captured, freely slidable configuration, assuring ease of operation and substantially eliminating any unwanting jamming of slider 44 within track guide 43.

Slider 44 also incorporates elongated channel 87 which extends the entire length of slider 44. As discussed above in reference to the embodiment of slider 42, channel 87 is employed for securely maintaining the printed circuit board in its desired position for insertion and interengagement with the input/output system of the present invention. As also discussed above, printed circuit board channel 87 preferably comprises a bevelled front edge in order to assure ease of insertion of the printed circuit board therein.

In this embodiment, slider 44 incorporates a supporting plate 88 mounted to the edge of slider 44 adjacent printed circuit board channel 87. Support platform 88 incorporates a through hole 89 position for interlocking engagement with pin members of the terminal block. The central axis of through hole 89 establishes the pivot axis for the terminal block when the terminal block is mounted therein. If desired, a small detent 90 may be positioned on the forward edge of support plate 88 in order to provide a positive lock for maintaining the terminal block in its normal installed position.

In addition, this embodiment of slider 44 incorporates movable arm 91 and 92, with a bevelled locking post 93 mounted to arm 91 and a bevelled locking post 94 mounted on arm 92.

In this embodiment, locking post 93 has its front surface substantially perpendicular to the central axis of slider 44 with its rear surface being bevelled. Locking post 94 is constructed with the opposite configuration, namely a lead surface which is bevelled and a rear surface which is substantially perpendicular to the central axis of slider 44.

Both arm members 91 and 92 are constructed in order to be flexibly movable inwardly upon the application of pressure while being resiliently returnable to their original position when the flexing force has been removed. In order to provide ease of movement of arm 91, slider 44 incorporates a forwardly protruding post 95 which establishes a secure member for use in moving arm 91.

In FIG. 13, slider 44 is shown installed in track guide 43 with locking post 93 in locking engagement with forward recess 84 of track guide 43. This configuration represents the first position of slider 44 wherein track guide 43 and slider 44, when installed in the input/output system of the present invention, the printed circuit board inserted in channel 87 would be in position ready for operation.

In FIG. 15, the second position of slider 44 in track guide 43 is shown wherein locking post 94 of arm 92 is now lockingly engaged in forward recess 84 of slider 43. In order to move slider 44 from its first, fully captured lockingly engaged position (FIG. 13) to its second open, lockingly engaged position (FIG. 15), the operator need only squeeze post 95 and arm 91 between two fingers, to cause arm 91 to pivot toward post 95. This pivoting action causes locking post 93 to disengage from recess 84, thereby allowing slider 44 to be ready for sliding advancement into its second position.

Although locking post 94 of arm 92 is engaged in a recess 84 of slider 43, the forward bevelled surface of locking post 94 causes arm 92 to advance inwardly, thereby automatically disengaging locking post 94 from engagement with recess 84 of slider 43 when slider 44 is to be advanced forwardly. As a result, the dislodgement of locking post 43 from the forwardmost recess 84 of slider 43 by squeezingly advancing arm 91 towards post 95, the operator can easily and simply advance slider 44 forwardly until locking post 94 reaches the forward most recess 84 of track guide 43 and snappingly engages therein. Once this second position is reached, as represented by FIG. 15, the slider is securely maintained in its second position allowing free access to the printed circuit board mounted therein or, alternatively, to the terminal block pivotably engaged on support plate 88.

As would be obvious to one skilled in the art, any of the particular features incorporated on either of the two slider assembly embodiments discussed above may be substituted for each other on the other of these embodiments. In addition, both the slider and the track guide are manufactured from plastic material, such as Lexan, in order to assure continuous ease and trouble-free slidability of the slider within the track guide. However, if desired, other materials may be employed without departing from the scope of the present invention.

TERMINAL BLOCK

Figure 16:
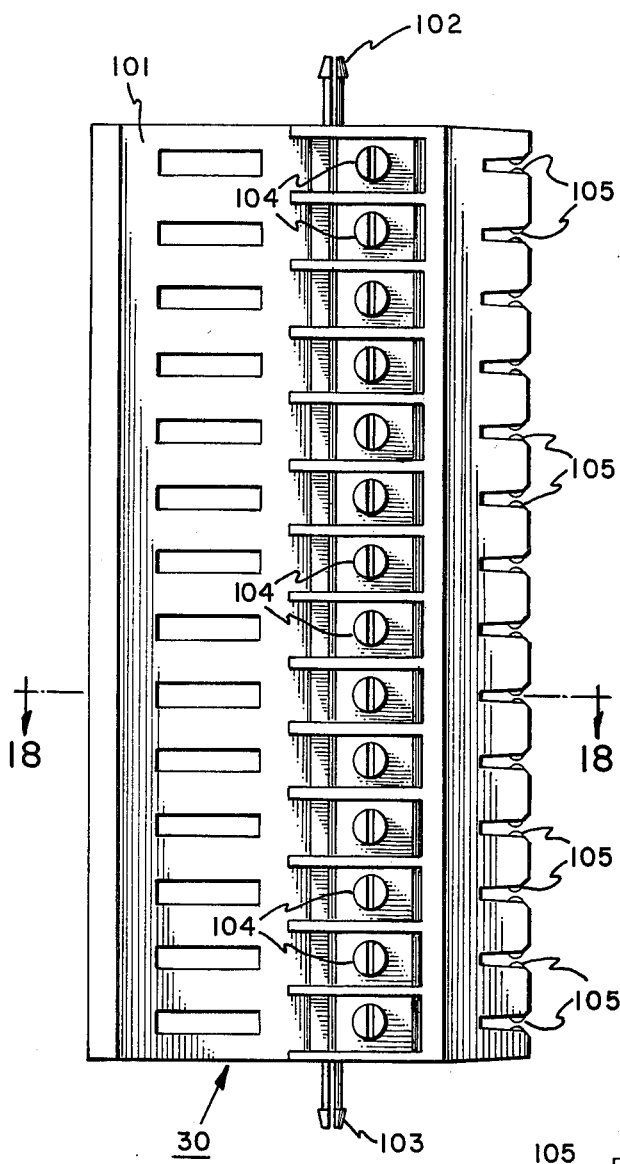
FIG. 16 is a side elevation view of the terminal block of the input/output system of this invention.
Figure 17:
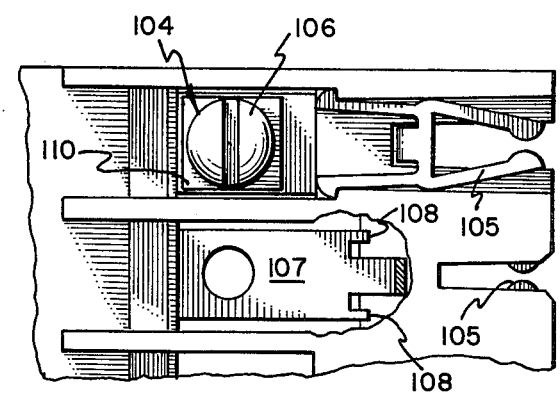
FIG. 17 is an exploded side elevation view of a portion of the terminal block, partially broken away.
Figure 18:
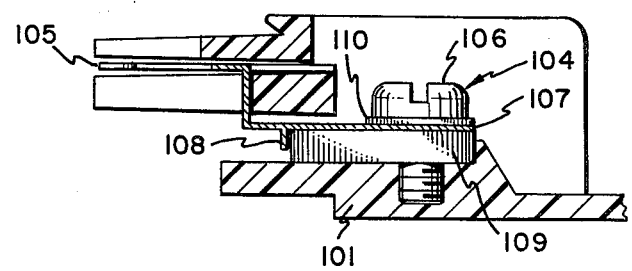
FIG. 18 is a cross-sectional end view taken along line 18—18 of FIG. 16.

By referring to FIGS. 16, 17 and 18, the construction and interconnection of external equipment with terminal block 30 of the present invention can best be understood. As shown in FIG. 16, terminal block 30 preferably comprises a substantially rectangular housing 101 incorporating a pivot pin 102 mounted along the top edge thereof and a second pivot pin 103 mounted along the bottom surface thereof, with both pins 102 and 103 being positioned along a common central axis. As shown in FIG. 2, pivot pin 102 is engaged in the accommodating hole of top slider assembly 92 while pivot pin 103 is positioned in the accommodating pivot hole formed in slider assembly 28.

As discussed above, when terminal block 30 has been mounted between the upper and lower slider assemblies, terminal block 30 is freely pivotable, preferably between about a 90 degree arc of rotation. As will be exemplified below, this pivoting motion is incorporated in order to provide ease of installation and rapid assembly of the entire input/output system of this invention.

In this embodiment, terminal block 30 comprises 14 independent wire connection points 104 for securely mounting the lead wires from the external equipment of the user to the input/output system. As best seen in FIG. 17, each connection point 104 is independently conductively connected to a forward facing contact pin 105 positioned along the front surface of housing 101 of terminal block 30. As shown in FIG. 17, in the preferred embodiment front contact pins 105 comprise a tuning fork shape in order to assure a quick and easy positive interconnection with a contact plate contained on front cover-connector, while also assuring quick and easy disconnection and self wiping.

In this embodiment, terminal block 30 comprises fourteen user equipment wire connection points, as well as the corresponding fourteen forward facing contact pins 105. Fourteen connection points are employed in order to provide a system which is capable of satisfying Japanese, European, and American wiring standards.

As shown in FIGS. 17 and 18, tuning fork contact pin 105 comprises a substantially flat metal stamping which extends rearwardly, and terminates in a substantially flat plate 107 which forms a part of the wire connection point 104. In addition, substantially flat plate 107 incorporates substantially perpendicular extending tabs 108 which cooperates with the user connection point 104.

In addition to substantially flat plate 107 and tabs 108, each user wire connection point 104 also incorporates a tapped steel plate 109, a threaded screw 106 and a pressure plate 110. Each connection point 104 is designed to accept either bare wire or ring lugs, whichever is preferred.

In order to install the user equipment, screw 106 need be disengaged, with the bare wire or ring lug of the user equipment wire being mounted between substantially flat plate 107 and pressure plate 110. The contact is then completed by merely threadedly advancing screw 106 within the tapped hole of plate 109 until secure firm contact has been made. The construction of pin 105 with substantially flat plate 107 and tabs 108 cooperate with plate 109 to provide sufficient strength to allow torquing the screw down until secure firm contact has been made.

From this construction, it is readily apparent that electronic engagement of the user's equipment in connection points 104 assures that pins 105 are also in active electronic engagement with the particular equipment wired to its cooperating connection point 104. As will be more fully described below, the plurality of tuning fork contact pins 105 enables the front cover-connector, with cooperating, pin-mating contact plates, to be inserted into terminal block 30 and simultaneously interconnect all of the external equipment connected to terminal block 30 with the input/output printed circuit board in a quick and easy one-step operation.

In the preferred embodiment, housing 101 comprises plastic material. In addition, housing 101 is designed to allow the plastic mold to be a single draw, thereby assuring ease of construction and assembly. Also, each user equipment connection point 104 is preferably constructed to accept a minimum of at least two number 14 AGW wires and a maximum of at least one number 22 AGW wire. Of course, any alternative material could be employed without departing from the scope of this invention.

WIRING INSTALLATION AND ELECTRICAL INTERCONNECTION OF INPUT/OUTPUT SYSTEM

Figure 19:
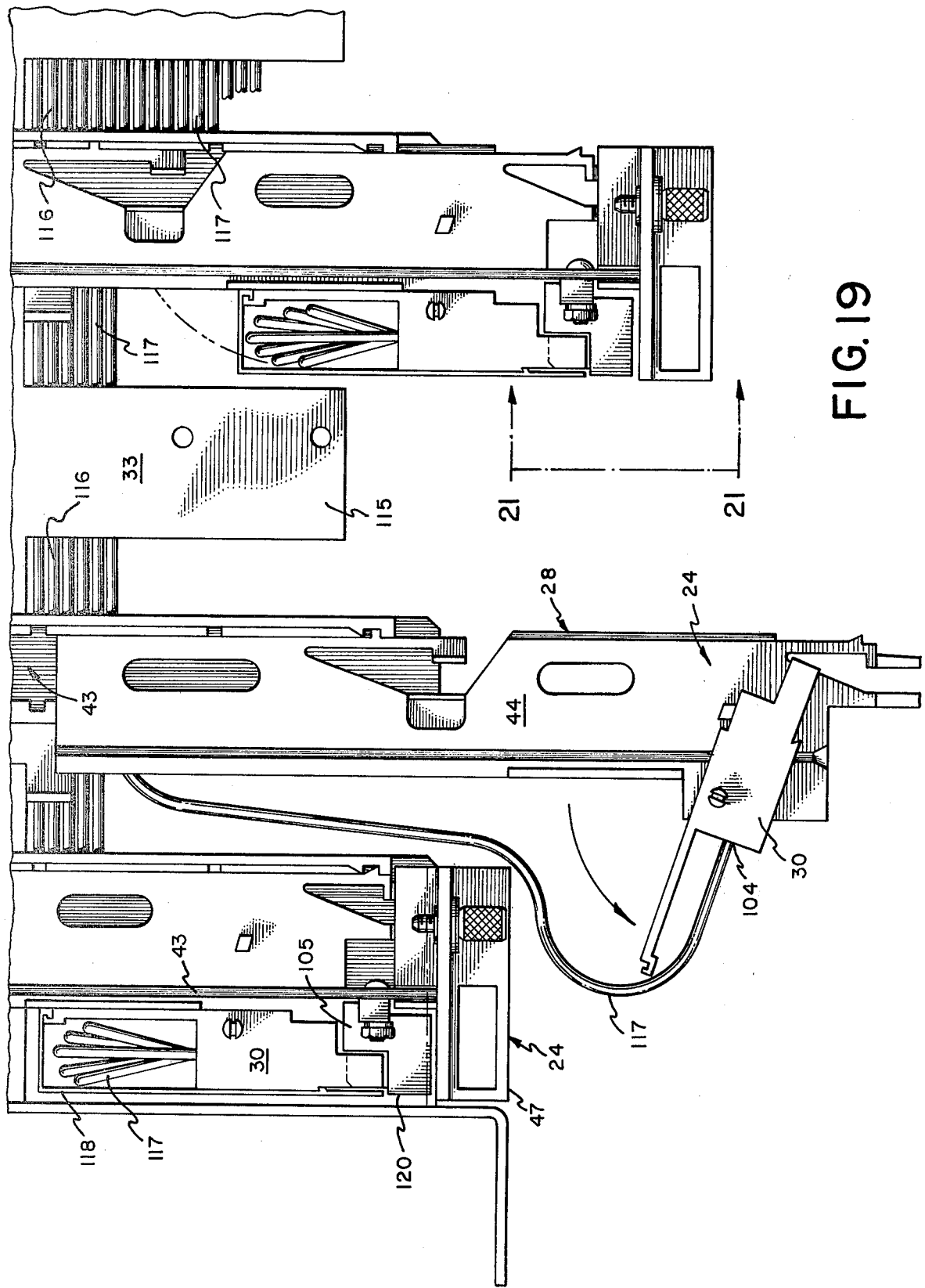
FIG. 19 is a cross-sectional top plan view, partially broken away, showing input/output modules of the input/output system of this invention in various stages of assembly.

In FIG. 19, input/output assembly 21 is shown with one input/output module 24 installed in place ready for operation, a second input/output module 24 being inserted into position, and a third input/output module 24 shown with lower slider assembly 28 positioned in its second, extended captured position with terminal block 30 pivoted forwardly for wiring of the user equipment thereto. Input/output assembly 21 comprises a lower support plate 33 which incorporates forwardly extending platforms 115 to which track guides 43 of lower slider assemblies 28 are securely mounted. Since platforms 115 each comprise independent finger-like extensions, a plurality of open, cavities 116 are formed therebetween. Open cavities 116 establish the required void area in which the user equipment wiring is maintained after having been securely mounted to terminal block 30.

As previously discussed in reference to FIG. 3, a wire support plate 39 is located below lower support plate 33. By mounting the open ended wire support plate 39 in juxtaposed spaced relationship to lower support plate 33, the void zone established therebetween provides a substantially enclosed wiring duct wherein all of the user equipment wiring to be connected to terminal blocks 30 of input/output system 21 is conveniently supportingly maintained.

As shown in FIG. 19, the plurality of user wires 117 extend within this zone supportingly maintained on support plate 39. Although the wires may enter from either the open ended left side or the open ended right side of input/output assembly 21, it has been found that greater convenience is generally achieved by feeding the wires into input/output system 21 from the right side. The wires are brought to each input/output system 21 through conventional wiring containment channels which are well-known in the art.

In order to interconnect an external device to an input/output module 24 of input/output system 21, the various wires coming from the particular external equipment are merely fed through the wired duct formed between wire support plate 39 and lower support plate 33 until the particular terminal block 30, to which the wire is to be connected, is reached. During the wiring operation, slider assembly 28 is moved into its extended position, with terminal block 30 rotated into its forward facing position, as shown in FIGS. 2 and 19. This forward facing position is employed for the purpose of wiring, since connection points 104 of terminal block 30 are most accessible to the user thereby providing optimum ease and convenience for the wiring installation.

In order to install the equipment wires to a terminal block 30, the particular wires from the user equipment are brought upwardly through cavity 116 of support plate 33, around the rear edge of terminal block 30 and securely mounted to the particular connection point 104 on terminal block 30. This process is repeated for each wire coming from the various external equipment to be controlled by the particular input/output module 24, until all equipment has been so connected to terminal block 30.

Once all of the external equipment desired to be controlled by a particular module has been wired to the various connection points 104 of terminal block 30, terminal block 30 is simply rotated back to its normal position ready for insertion into input/output system 21. As described above, locking mechanisms are preferably incorporated on slider assembly 28 in order to assure secure locked interengagement and holding of terminal block 30 in this normal, installed position. Preferably, wire cover 118 is installed on terminal block 30 prior to inserting the module into input/output system 21. Wire cover 118 is preferred to prevent unwanted contact with connection points 114 and possible shorting thereof.

With terminal block 30 rotated into position ready for insertion in input/output system 21, slider 44 of slider assembly 28 is disconnected from its extended engaged position and advanced rearwardly into input/output assembly 21 until its first fully engaged locked position is reached. This rearward movement is shown in FIG. 19. As slider 44 advances inwardly into input/output system 21, the various wires connected to the particular terminal block 30 move rearwardly into cavity 116 and are then maintained therein between adjacent input-/output modules 24.

This construction has been found to be extremely advantageous, since all of the user wiring is maintained out of normal view. Therefore, the wires are not susceptible to undesirable and unwanted handling, as well as provide a more attractive system since the wires are not visible. Also, the wires are located in a position isolated from the active components of the printed circuit board.

Figure 20:
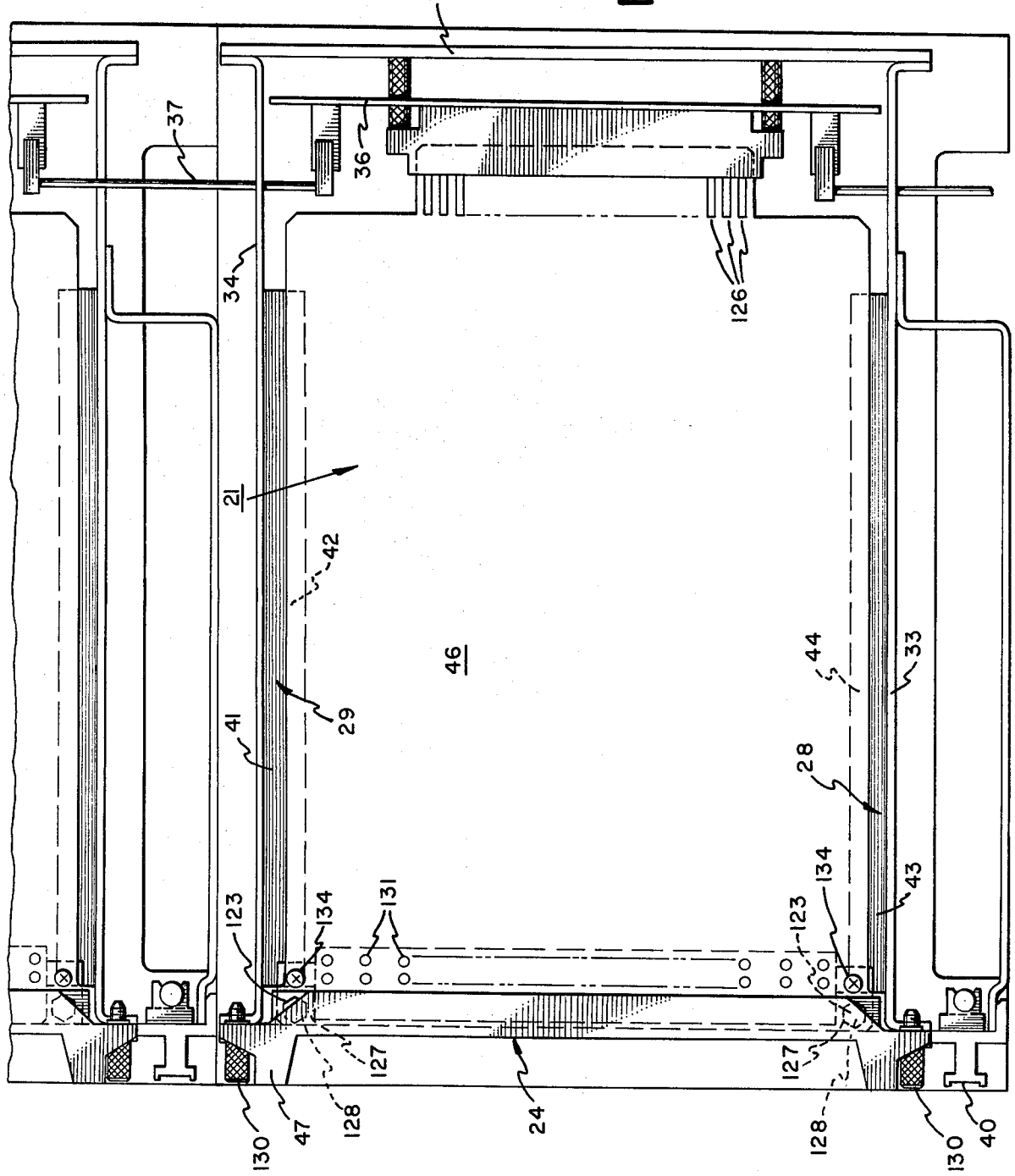
FIG. 20 is a cross-sectional side elevation view of two input/output systems of this invention in electronic interengagement.

Input/output system 21 is completed and readied for operation by inserting printed circuit board 46 into the input/output assembly and mounting front cover connector 47 in place to provide the electronic interconnection of the input/output printed circuit board 46 with the external equipment wired to terminal block 30. In FIGS. 19 and 20, one input/output module 24 is shown in its fully assembled position ready for operation.

As shown therein, terminal block 30 is in its installed position with wires 117 connected thereto. Sliders 42 and 44 of slider assembly 28 and 29 are in their fully engaged positions with track guides 41 and 43, and printed circuit board 46 is in its inserted, supportingly contained position between slider assemblies 28 and 29. In addition, front cover connector 47 is mounted to input/output system 21 providing the required electronic interconnection between terminal block 30 and printed circuit board 46.

In FIG. 20, a completely assembled input/output system 21 is shown with an input/output module 24 assembled ready for operation. As shown in FIG. 20, printed circuit board 46, when fully supportingly maintained between lower slider assembly 28 and upper slider assembly 29 is interconnected with the central processor through rear connector 45 which electronically engages and interconnects edge contacts 126 formed along a rear extension surface of printed circuit board 46. Rear connector 45 is electronically engaged to back plane mother board 36 in the conventional manner and interconnected with adjacent input/output systems via cable 37. In addition, back plane mother board 36 incorporates switches, well-known in the art, to provide desired address selection for processing information from input/output assemblies 21, as well as directing and processing information between the various input/output modules 24 of an individual input/output system 21.

FRONT COVER CONNECTOR

Figure 21:
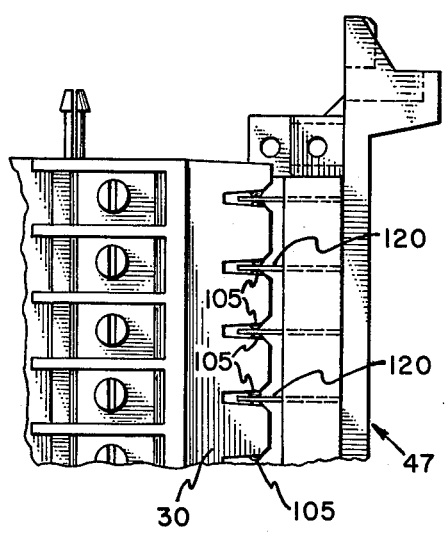
FIG. 21 is an enlarged side elevation view of a portion of the input/output module taken along line 21—21 of FIG. 19.

In FIG. 21, front cover connector 47 is shown being inserted into electrical interengagement with forked contact pins 105 of terminal block 30, while FIG. 21 details the construction of front cover connector 47. For each contact pin 105, cover connector 47 incorporates a substantially flat contact plate 120 which is constructed for rapid installation and complete electrical engagement with a pin 105. In this way, electrical interconnection of front cover connector and printed circuit board 46 with all the external equipment connected to terminal block 30 is provided in a quick, simple, one step operation.

Whenever printed circuit board 46 must be removed, only front cover connector 47 need be withdrawn from mated contact with in pins 105. Consequently, the equipment wiring remains intact and complete electrical disconnection is achieved rapidly, easily and efficiently.

Figure 22:
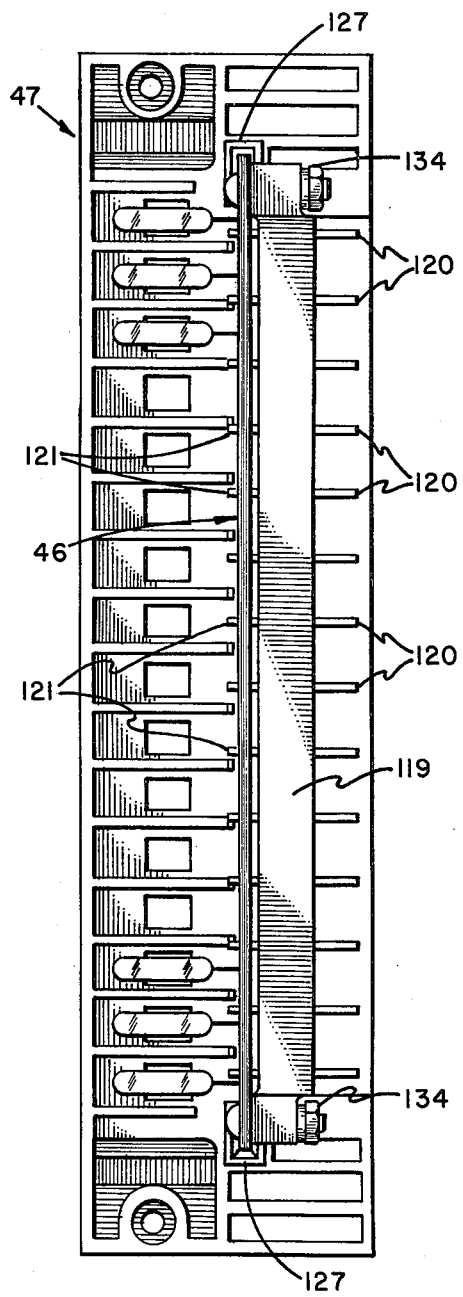
FIG. 22 is a cross-sectional rear elevation view of a printed circuit board mounted in a front cover connector ready for insertion in the input/output system of this invention.

In the embodiment shown in FIGS. 19, 21, and 22, front cover connector 47 incorporates a rear housing 119 wherein the plurality of substantially flat contact plates 120 are contained and supportingly maintained in spaced non-conductive relation to each other. Each contact plate 120 also incorporates an extension post 121 which is positioned for engagement with post receiving means 124 mounted to printed circuit board 46. Post receiving means 124 may comprise any one of a plurality of mating configurations well known in the art.

In the preferred embodiment, printed circuit board 46 is affixed to front cover connector 47 in order to provide a positive, readily available and readily accessible component which will enable printed circuit board 46 to be easily disconnected and removed from input/output system 21 without having to directly touch printed circuit board 46. As shown in FIGS. 20 and 22, printed circuit board 46 is securely mounted to front cover connector 47 at the top and bottom forward corners thereof. In a preferred embodiment, holding clips 127 are formed in cover connector 47 and cooperating holes 123 are formed in printed circuit board 46. When holes 123 of printed circuit board 46 are inserted into clips 127, circuit board 46 is securely engaged to front connector 47 by simply mounting fastening means 128 through holding clips 127 and holes 123. In this way, printed circuit board 46 is maintained in secure holding engagement with cover connector 47.

In addition, front cover connector 47 also incorporates quick disconnect locking pins 130 which matingly engage with the top and bottom support plates of input-/output system 21, as shown in FIG. 20. In this way, front cover connector 47 and printed circuit board 46 can be inserted into input/output systems 21, and quickly locked in position. However, if removal or replacement of front cover connector 47 and printed circuit board 46 is required, locking pins 130 can be quickly disconnected, assuring quick and rapid accessibility to the input/output printed circuit board.

In FIG. 20, an alternative interconnection system is shown for assuring that the fourteen contact points along the forward edge of printed circuit board 46 will be in continuous and trouble-free electronic engagement with the fourteen contacts of terminal block 30. In this alternative embodiment, front cover connector 47 incorporates contact plates having dual pins extending sideways for mating interconnection with dual pin receiving holes 131 formed in printed circuit board 46. Once each of the dual pins have been inserted into the cooperating holes 131 of printed circuit board 46, the pins are soldered in position in order to assure secure continuous electronic engagement with printed circuit board 46. Also, if desired, front edge contacts may be employed similar to edge contacts 126 used along the rear surface of printed circuit board 46. By employing edge contacts along the front edge of printed circuit board 46, front cover connector 47 would be completely removably connectable from printed circuit board 46 when disconnected from input/output system 21.

If desired, holder 119 of front cover connector 47 may comprise a separate unit adapted for mounting to front connector 47, as well as being mountable to printed circuit board 46. This construction is shown in FIG. 20, wherein fastening means 134 securely mount the separate holder 119 to printed circuit board 46. With printed circuit board 46 securely mounted to cover connector 46, the entire system is secure. Of course, any alternative interconnecting and securing means may be employed.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. An expandable, multi-purpose input/output system interconnected with a central processor to form a machine controller interconnected with and operating external devices, comprising
   A. a housing incorporating means for communicating with the central processor;
   B. a printed circuit board incorporating
      a. means for disengageably interconnecting said printed circuit board with the communicating means of the housing, and
      b. a plurality of electrically independent contacts for communicating with the external equipment;
   C. a slider system
      a. mounted in the housing,
      b. movable from a first, locked, housing-inserted position to a second, locked, partially withdrawn position, and
      c. incorporating means for supportingly holding the printed circuit board in the housing in disconnectable communication with the central processor;
   D. a terminal connector block mounted to the slider assembly and comprising
      a. a plurality of wire connection points for electrically connecting the external equipment to the input/output system, and
      b. a plurality of quick disconnect contacts, with each of said contacts being independently conductively associated with one wire connection point; and
   E. a connector panel incorporating a plurality of conductively independent contacts for electrically interconnecting the quick disconnect contacts of the terminal connector block with the plurality of electrically independent contacts of the printed circuit board;
whereby an input/output system is achieved wherein the external equipment wires are easily connected to the terminal connector block by supportingly extending the connector block to a position outside of the housing, wherein the printed circuit board is quickly and easily disengageably inserted and interconnected with the central processor, and wherein complete electrical interconnection of the external equipment through the printed circuit board to the central processor is made quickly and easily without requiring disassembly of the external equipment wires for removal, replacement or repair of the printed circuit board.

2. The input/output system defined in claim 1, when the slider system is further defined as comprising
   d. two slider assemblies,
      1. a first of said slider assemblies being mounted to an upper surface of the housing, and
      2. a second of said slider assemblies being mounted to a lower surface of the housing, and
   e. both of said slider assemblies being in juxtaposed, spaced, cooperating, facing relationship to each other.

3. The input/output system defined in claim 2, wherein each slider assembly is further defined as comprising two cooperating components, said components comprising
   3. a track guide fixedly mounted to the housing and incorporating guide means longitudinally extending substantially the entire length of said track guide, and
   4. a slider incorporating engaging means for cooperative sliding interengagement with said guide means of the track guide.

4. The input/output system defined in claim 3, wherein said track guide is further defined as incorporating a locking recess formed in the forward end of the track guide and said slider incorporates recess engaging means formed thereon and positioned for locking interengagement with said recess of the track guide to removably lockingly maintain the slider assembly in its alternative positions.

5. The input/output system defined in claim 4, wherein recess engaging means of the slider is further defined as comprising
   (i) a first movable arm formed on the slider along a forward edge thereof,
   (ii) a second movable arm formed on the slider rearwardly of the first arm, and
   (iii) each of said arms having a locking post formed thereon for locking interengagement with the recess of the track guide.

6. The input/output system defined in claim 5, when said track guide is further defined as comprising a bevelled surface positioned directly behind the locking recess, and the recess engaging means of the slider further comprises
   (iv) a rear bevelled surface formed on the locking post of the forward arm of the slider, and
   (v) a rectangular shaped locking post formed on the rear arm of the slider,
whereby disengagement of the forward arm from its locked position allows the slider to advance along the track guide and automatically lockingly engage the recess of the track guide when the substantially rectangular shaped locking post of the rear arm is pivoted out of its locking position by the bevelled surface rearward of the recess and then automatically engaging the recess once the slider is advanced beyond the bevelled surface.

7. The input/output system defined in claim 5, wherein said slider further comprises a forwardly extending rigid projection in juxtaposed spaced relationship with the forward arm, providing a rigid support with which the forward arm can be easily disengaged from its locked position by a squeezing action.

8. The input/output system defined in claim 3, wherein said track guide is further defined as comprising mounting pins extending from the lower surface thereof for snap-in interengagement with the housing.

9. The input/output system defined in claim 3, wherein said track guide is further defined as comprising a plurality of recess symmetrically disposed along at least one edge thereof, thereby providing a symmetrical construction for use as both the upper and lower track guide.

10. The input/output system defined in claim 1, wherein said terminal connector block is further defined as being
   c. pivotally mounted to the slider system, and
   d. movable between
      1. a first position with said plurality of wire connection points being forward facing, and
      2. a second position with said plurality of quick disconnect contacts being forward facing.

11. The input/output system defined in claims 3 or 10, wherein said slider is further defined as comprising pivot restraining means for supportingly retaining and confining the terminal connector block within its arc of rotation between its two positions.

12. The input/output system defined in claims 3 or 10, wherein said track guide is further defined as comprising a locking member positioned for securely retaining the terminal connector block in its second position when the slider is in its housing inserted position.

13. The input/output system defined in claim 1, wherein said housing is further defined as comprising two side mounting plates, each of said side mounting plates being reversibly mountable to the housing to provide a housing capable of being constructed for either panel mounting or rack mounting.

14. The input/output system defined in claim 1, wherein said housing is further defined as comprising
   a. a lower support plate incorporating a plurality of forwardly-extending, independent finger-like projections, establishing a plurality of elongated cavities therebetween, said projections forming the surface on which said slider system and printed circuit board are supportingly maintained, and
   b. a wire supporting duct formed below said lower support plate,
whereby the external equipment wires are contained within the wire duct and fed through the elongated cavities to the terminal connector block.

15. The input/output system defined in claim 1, wherein each of the plurality of conductively independent contacts of the connector panel incorporate at least one elongated post member for conductive interconnection with said electrically independent contacts of said printed circuit board.

16. The input/output system defined in claim 15, wherein the plurality of electrically independent contacts of said printed circuit board comprise post receiving contacts.

17. The input/output system defined in claim 15, wherein said plurality of electrically independent contacts of the printed circuit board comprise soldered connections on the printed circuit board of the post members of the connector panel.

18. The input/output system defined in claim 1, wherein said printed circuit board is removably mounted to the rear surface of the connector panel along the forward edge of the printed circuit board, thereby providing a self supported printed circuit board which can be easily handled and quickly inserted into its rapidly disengageable interconnection with the input/output system.

* * * * *